United States Patent [19]

Novitski

[11] 3,940,701

[45] Feb. 24, 1976

[54] TELEVISION REMOTE CONTROL DEVICE

[76] Inventor: Edward Novitski, 1690 26th East, Eugene, Oreg. 97403

[22] Filed: Jan. 20, 1975

[21] Appl. No.: 542,494

[52] U.S. Cl........ 325/392; 178/DIG. 15; 179/1 SW; 179/1 VL; 325/393; 343/228
[51] Int. Cl.² .......................................... H04B 1/16
[58] Field of Search............. 250/199; 178/DIG. 15; 325/37, 391–393, 395; 343/225, 228; 179/1 SW, 1 VL

[56] References Cited
UNITED STATES PATENTS

| | | | |
|---|---|---|---|
| 2,903,575 | 9/1959 | Polley | 325/392 |
| 3,116,454 | 12/1963 | Morris | 325/391 |
| 3,294,901 | 12/1966 | Stanghi | 178/6 |
| 3,424,865 | 1/1969 | Marchand | 178/5.8 |
| 3,537,012 | 10/1970 | Reichard et al. | 325/392 |
| 3,713,028 | 1/1973 | Boyd et al. | 325/392 |
| 3,870,956 | 3/1975 | Wolff | 325/478 |

*Primary Examiner*—Richard Murray
*Assistant Examiner*—Marc E. Bookbinder
*Attorney, Agent, or Firm*—Chernoff & Vilhauer

[57] ABSTRACT

A television remote control device responsive to illumination by a light beam for muting the audio output of a television receiver and automatically disabling the receiver a predetermined period following the muting thereof. A photo-responsive circuit generates a first set of control signals in response to the illumination of a portion thereof by a light beam. An audio control circuit mutes the audio output of the television immediately in response to the first signals, and a time-delay circuit responsive to the photo-responsive circuit generates a disabling signal a predetermined period following the generation of the first signals. A power control circuit disables the television by disconnecting its electrical input power in response to the disabling signal. A reset circuit is provided for manually turning the television on thereafter. If the photo-responsive circuit is illuminated a second time prior to the end of the aforementioned predetermined time period, a second set of control signals is generated which restores the audio output to its original amplitude and inhibits the generation of a disabling signal by the time-delay circuit. The various circuits may be of either electro-mechanical or electronic design, and the device may be included as original equipment or as a separate accessory to a television receiver.

12 Claims, 4 Drawing Figures

3,940,701

TELEVISION REMOTE CONTROL DEVICE

BACKGROUND OF THE INVENTION

This invention relates to control devices for use with television receivers, in particular remote control devices responsive to illumination by a light beam for controlling the audio output and electrical power input to a television receiver.

In viewing and listening to a television receiver it is often desirable to mute the sound thereof during interruptions. A particularly annoying interruption generated by the television itself is the commercial time-out during which the programming is temporarily stopped and replaced with one or more advertisements. Typically these commercials are of little interest to the viewer and are often noisy; thus it is useful to be able to mute the television's audio output during these commercials in order to enable persons in the viewing room to carry on a conversation. In addition, a television viewer is frequently interrupted by telephone calls and conversations with other persons during which it would be convenient to mute the sound of a nearby television.

It is also desirable to be able to mute the television by remote control, since television commercials occur frequently enough that it would be a greater annoyance than the sound to walk over to the television every time a commercial is broadcast, and since the ability of the viewer to mute the television from the viewing position would save the viewer time in answering a telephone or carrying on other activities during a commercial break.

While it is desirable to be able to mute the audio output of a television during interruptions, such action produces a problem in that when the viewer leaves his viewing position to pursue some other task he can easily forget about the television and not return to turn it off because the sound no longer reminds him that the television is on. Of course the viewer will eventually return to use the television or turn it off, but in the interim the remaining lives of the parts of the television have been needlessly reduced and valuable electrical energy has been wasted. Therefore it would be extremely desirable to provide such a remote control device which disables the television by automatically turning it off a predetermined time following its muting unless the viewer restores the audio to a listening level.

Other devices have previously been designed for controlling the audio output and power of a television receiver from the remote position of the viewer. For example, Polley U.S. Pat. No. 2,903,575 shows a primarily electronic device responsive to the illumination of a light beam for, among other things, turning a television receiver on and off and varying the amplitude of its audio output. However, it is particularly significant that the Polley control system makes no provision for automatically disabling the television if the audio is not restored to a listening level following its muting.

SUMMARY OF THE PRESENT INVENTION

The present invention provides a remotely actuated television receiver control device which both meets the above-described needs of the television viewer and overcomes the drawbacks of prior art television control devices. This is accomplished by circuitry which mutes and restores the audio output of a television receiver in response to illumination by a light beam, such as that produced by an ordinary flashlight, and disables the television by disconnecting its electrical power input automatically a predetermined period of time following the muting of the sound unless the sound is restored prior to the end of that time period. The device may be original equipment or an accessory to a television.

Remote actuation of the control device is provided by a photo-responsive circuit which produces a set of control signals in response to the illumination of a portion thereof by a light beam. This enables the device to be operated by an ordinary flashlight and enables the viewer to operate the device without leaving his viewing position during a commercial break, or being side-tracked to the television prior to pursuing some other activity.

An audio control circuit responsive to the control signals from the photo-responsive circuit reduces the amplitude or "volume" of the audio output of the television receiver as a result of a first actuation of the device. Also, assuming that the television has not been automatically shut off already, the audio control circuit restores the amplitude of the audio output in response to a second actuation of the device by illumination of the photo-responsive circuit.

A time-delay circuit generates a disabling signal a predetermined time period following the muting of the television sound unless a subsequent actuation of the device restores the sound prior to the end of the aforementioned predetermined period. Preferably this predetermined period is somewhat longer than the potentially longest commercial break but short enough that the television receiver will be shut off not long after it is reasonably probable that it has been forgotten by the viewer.

A power control circuit, which may be interposed between the electrical wall output and the television power input or otherwise connected to the power circuit of the television, permits the television receiver to be operated by the remote control device. When the time-delay circuit generates a disabling signal the power control circuit automatically shuts off all power to the television thereby saving a portion of the useful life of the parts of the television and conserving electrical energy. A reset circuit is provided for turning the television back on following automatic shut-off.

The device may be either primarily electromechanical or electronic, depending upon the objectives of the builder. An electro-mechanical device as described herein can be built from relatively inexpensive relays, but should ideally include an override circuit if a thermal time-delay relay is used to establish the predetermined time period since such a relay requires a "cooling off" period before returning to its normal state. Thus, while a primarily electro-mechanical device may be somewhat inexpensive it may be slightly more difficult to operate than is necessary and is subject to the usual wear and tear problems of mechanical devices. On the other hand, while a primarily electronic device as shown herein is slightly easier to operate than a primarily electro-mechanical device and is likely to be more durable, it may also be more expensive to produce.

It is therefore a principal object of the present invention to provide a new and improved television receiver remote control device for regulating the audio output and power input of the television in response to the illumination of a portion of the device with a light beam.

It is a further object of the present invention to provide such a television control device which mutes the audio output of a television receiver and automatically disables the television a predetermined period following the muting thereof unless the audio output of the television is restored prior to the end of the predetermined time period.

It is a principal feature of the present invention that the control device utilizes a photo-responsive circuit for actuating the device and a time-delay circuit for measuring the predetemined time period following actuation of the device to automatically disable the television.

The foregoing and other objectives, features, and advantages of the invention will be more readily understood upon consideration of the following detailed description of the invention, taken in conjunction with the accompanying drawings.

DESCRIPTION OF THE PREFERRED EMBODIMENT

Figure 1:
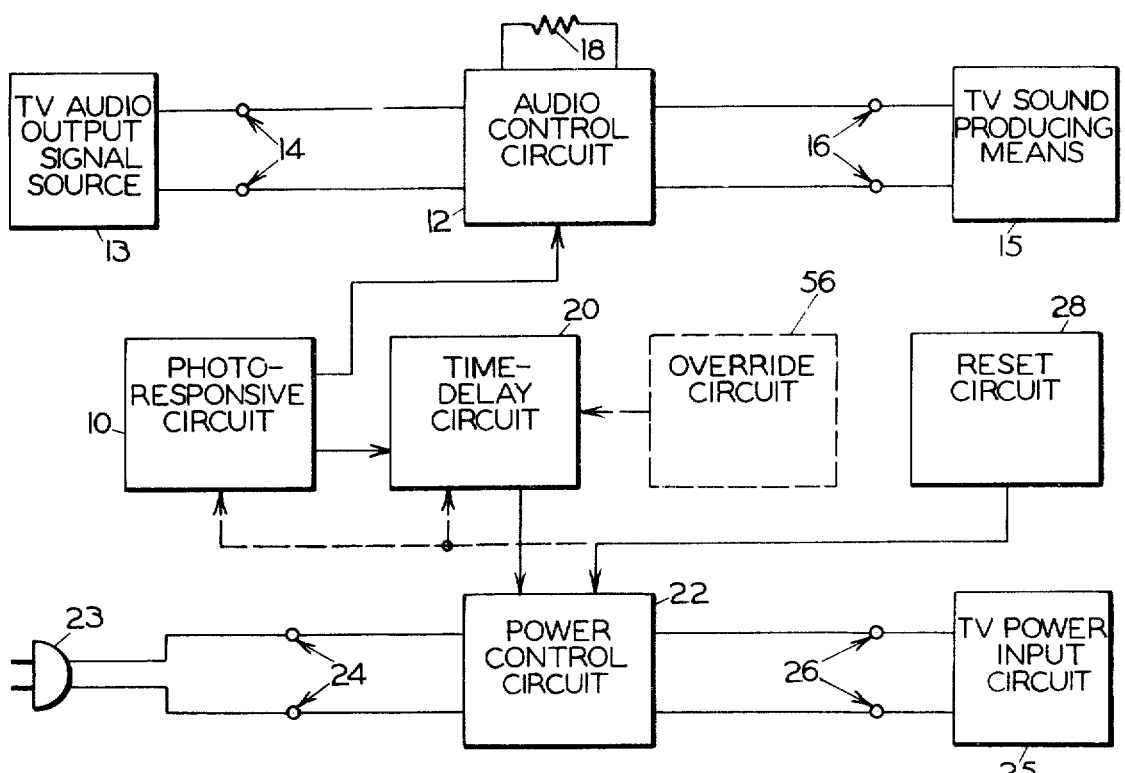
FIG. 1 is a block diagram of the control device of the present invention representing the major circuit functions thereof.

Referring to FIG. 1, actuation of the television receiver control device commences by illuminating a photo-sensitive portion of a photo-responsive circuit 10 with a light beam generated, for example, by a flashlight. Assuming that the television receiver is initially enabled or "turned on" and the amplitude or "volume" of the audio output is adjusted to a reasonable listening level, when the photo-responsive circuit 10 is actuated it generates a control signal which operates an audio control circuit 12 to mute the audio output. The audio control circuit 12 is connected to the audio output circuit of the television receiver, ordinarily by interposition between the electrical audio output signal source of the television receiver attached to the audio input 14 of the control device, and the television sound producing means 15 such as a speaker attached to the audio output 16, but when the photo-responsive circuit 10 is actuated it causes the audio control circuit 12 to disconnect the circuit between the audio input 14 and the audio output 16 thereby muting the television receiver. While the simplest design would permit the audio merely to be either on or off, the device could be designed to mute the audio in some other manner such as decreasing the amplitude to a predetermined audible level. Since disconnection of the speaker while the receiver is on can cause damage to the audio output circuitry of some televisions, the audio control circuit 12 substitutes a quiet impedance 18, such as an ordinary resistor, for the television speaker by connecting it to the audio output signal source 13 of the television receiver when the television is muted.

At the same time that the audio control circuit 12 is actuated by the photo-responsive circuit 10, a time delay circuit 20 is also actuated. The time-delay circuit measures the time starting with the moment when the photo-responsive circuit 10 produces a first set of control signals indicating that the control device has been actuated to mute the television receiver. After a predetermined time determined by the components chosen for the time-delay circuit 20, or alternatively by a variable adjustment included in the time-delay circuit, a disabling signal is generated by the time-delay circuit assuming that no intervening second set of control signals has been generated. However, an intervening actuation of the control device resulting in the production of a second set of control signals from the photo-sensitive circuit 10 will stop the generation of a disabling signal and cause the audio control circuit 12 to restore the audio output of the television to its orignal amplitude. The time period before the time-delay circuit 20 will generate its disabling signal is a time chosen as a measure of the viewer's forgetfulness. That is, it is that predetermined time period after which it is assumed that the viewer who caused the television to be muted has forgotten that he has left the television on.

A power control circuit 22 responsive to signals from the time-delay circuit 20 is provided to enable and disable the television receiver, preferably by connecting and disconnecting its electrical power input respectively. To accomplish this purpose the power control circuit 22 is interposed between the electrical wall outlet connected to the power input 24 of the control device by a plug 23 for example and the electrical power input circuit 25 of the television receiver connected to the power output 26 of the device. The power control circuit also provides power for operation of the control device, and means for turning the television receiver on and off manually. Initially, when the television receiver is turned on, electrical power passes from the power input 24 to the power output 26, but when the photo-responsive circuit 10 has produced a control signal which causes the time-delay circuit 20 to generate a disabling signal after the aforementioned predetermined time period, the power control circuit responds by shutting off the television receiver. A reset circuit 28 also is provided for enabling or "turning on" the television receiver following an automatic shut-off caused by the time-delay circuit. It will be understood that, if the control device is to be used as a television accessory rather than original equipment, the various component circuits of the device are interconnected as an integral unit with the inputs 14 and 24, and outputs 16 and 26 of the control device, comprising any of a variety of conventional terminals or plugs, without disrupting the interconnection between the various component circuits of the control device.

Figure 2:
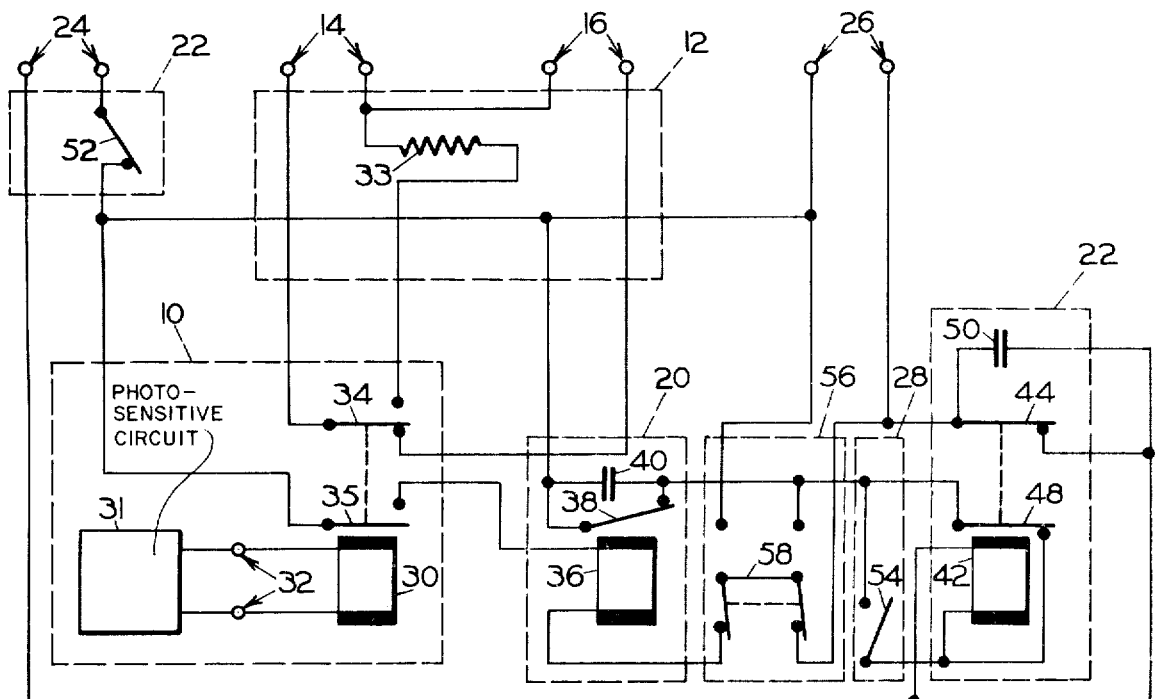
FIG. 2 is a schematic diagram of a primarily electromechanical embodiment of the present invention corresponding to the block diagram of FIG. 1.

Turning now to FIG. 2, in the primarily electromechanical embodiment of the invention shown, the photo-responsive circuit 10 comprises a relay 30, two switches 34 and 35 operated thereby and any of a variety of conventional photo-sensitive circuits 31 attached to the actuation input 32 which alternately generate and terminate a current in response to successive illuminations thereof by light. Normally the relay 30 is a de-energized and the switch 34 operated by the relay 30 connects the audio input 14 to the audio output 16 thereby connecting the sound producing device of the television receiver to its electrical audio output circuit. When the photo-sensitive circuit 31 attached to the actuation input 32 is first momentarily illuminated it generates a current applied to relay 30 and consequently the relay 30 is energized which causes the switch 34 to disconnect the output 16 from the input 14 and connect a resistor 33 to the input 14 thereby muting the sound of the television receiver and connecting a substitute impedence to the electrical audio output circuit of the television. A second momentary illumination of the photo-sensitive circuit 31 will terminate the current applied to the relay 30 thereby disconnecting the resistor 33 and restoring the television sound. Thus, in this embodiment the audio control circuit 12 comprises the resistor 33 and the associated wiring which interconnects the resistor, the switch 34, the input 14 and the output 16.

The time-delay circuit 20 comprises a thermal time-delay relay 36, a switch 38 operated thereby and a capacitor 40. Ordinarily the relay 36 is de-energized and the switch 38 is closed causing power to flow to the power control circuit 22. However, when the photo-responsive circuit 10 is actuated the relay 30 closes the switch 35 which energizes the relay 36 of the time-delay circuit. Due to the combination of thermal and electrical characteristics of the relay 36 the switch 38 remains closed for an appropriate predetermined period of time following activation of the device, for example at least three minutes and preferably more. When the predetermined period of time has ended the relay 36 opens the switch 38, stopping the power flow to the power control circuit 22 and thereby signalling the power control circuit to disable the television receiver by cutting off the input power. The capacitor 40 across the switch 38 serves to reduce undesirable transient electrical effects otherwise resulting from the opening and closing of the switch 38. If the viewer restores the television sound by shining a light on part of the photo-sensitive circuit 31 prior to the end of the predetermined time period the switch 35 will be opened and relay 36 will be de-energized which prevents it from opening switch 38 and cutting off power to the power control circuit.

In the power control circuit 22, a relay 42 is ordinarily energized which maintains closure of a switch 44 thereby permitting power to flow from the power input 24 to the power output 26. In addition the relay 42 maintains closure of a switch 48 which completes the circuit to the coil of relay 42; therefore, once the relay 42 is energized it maintains itself in that status until some intervening event such as the occurrence of a disabling signal from the time-delay circuit.

Assuming that the photo-responsive circuit 10 has been actuated to energize the relay 30 and mute the sound of the television, and that the aforementioned predetermined time period is allowed to pass without a prior second actuation of the photo-responsive circuit, the switch 38 of the time-delay circuit will open, cutting off power to the power control circuit. This will de-energize the relay 42 which allows the switch 44 to open and disables the television receiver by cutting off its input power. De-energization of the relay 42 also opens the switch 48 which maintains the relay 42 in a de-energized state until it is reset. The power control circuit also includes a capacitor 50 for reducing unwanted transients from the opening and closing of the switch 44, and a power switch 52 for manually turning the television receiver off. Preferably the power switch is a spring-loaded switch which is normally closed so that power is always available to the control device. When the power switch is momentarily opened power is disconnected from the relay 42 which locks into a disabled state until reset.

In order to turn the T.V. receiver on, a reset switch 54 is provided in the reset circuit 28. Preferably the switch 54 is spring-loaded and normally open. When the switch 54 is momentarily closed it energizes the relay 42 of the power control circuit which enables the television receiver and thereafter remains energized even though the switch 54 is released. Since the relay 42 maintains its most recent status it provides the advantage of easy reset operation of the television control device by a push-button reset switch and, more importantly, permits the photo-responsive circuit to be de-energized along with the television once the control device has automatically disabled the television thereby saving electricity.

Since the thermal time-delay relay 36 does not dissipate the energy supplied thereto immediately following de-energization, the switch 38 will remain open for a short time following automatic shut-off of the television receiver even though the thermal time-delay relay is simultaneously de-energized. In order to allow the viewer to enable the television receiver immediately following automatic shut-off despite the aforementioned characteristic of the thermal time-delay relay, an override circuit 56 is provided, as shown in FIGS. 1 and 2. The override circuit 56 comprises a bypass switch 58 which ordinarily completes the circuit to the thermal time-delay relay 36; however, when it is desired to prevent the affect of the thermal time-delay relay the override switch permits the viewer to disable the thermal time-delay relay with the bypass switch 58 thereby permitting relay 42 to be energized. The bypass switch is also useful in situations where the viewer may wish to remotely mute the television but does not want the time delay and automatic turn-off function to operate.

Figure 4:
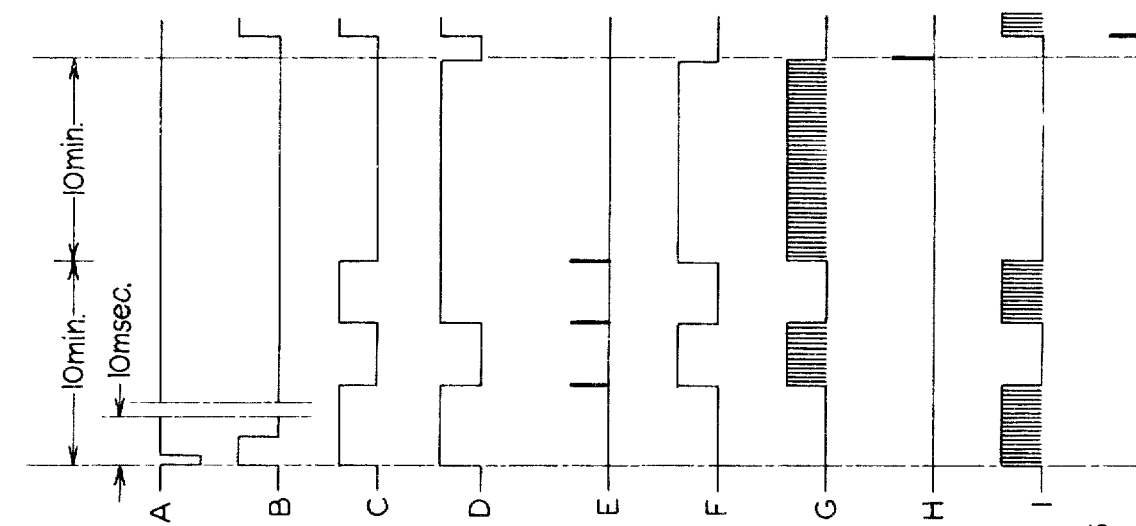
FIG. 4 is a diagram showing waveforms of signals at various points in the circuit of the electronic embodiment of FIG. 3 and their relative times of occurrence.
Figure 3:
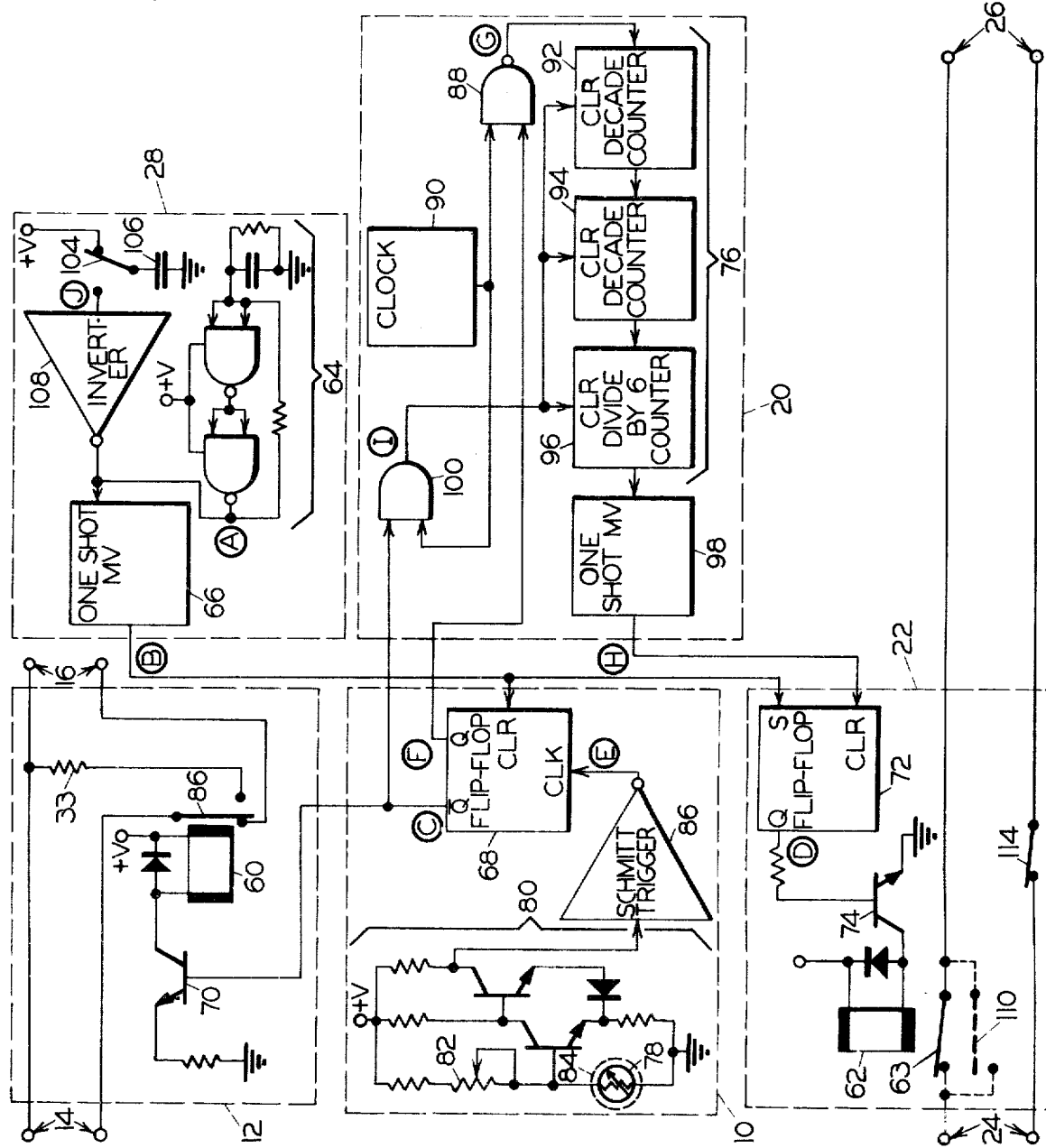
FIG. 3 is a schematic diagram of a primarily electronic embodiment of the present invention corresponding to the block diagram of FIG. 1.

With reference now to FIGS. 3 and 4, the primarily electronic embodiment of the present invention also utilizes a pair of relays 60 and 62 for controlling the audio output and power input of the television receiver respectively. Thus the primary difference between these two particular embodiments is that the predetermined time period is measured electronically which simplifies the operation of the control device somewhat. However, it is recognized that an entirely electronic version could be built by replacing the two relays 60 and 62 with equivalent, entirely electronic, circuits.

Initially, when the control device is first turned on, a starting circuit 64 included in the reset circuit 28 produces a short negative-going pulse (FIG. 4A) which triggers a one shot multi-vibrator 66 in the reset circuit and produces a positive going reset pulse from one to ten milliseconds in duration (FIG. 4B). Although a specific exemplary starting circuit 64 is shown it is recognized that any of a variety of appropriate single-pulse generating circuits might be used for the same purpose.

The initial reset pulse performs three functions. First, it clears an audio control bistable multi-vibrator or "flip-flop" 68 in the photo-responsive circuit 10. This causes the flip-flop 68 to produce a positive voltage at its Q output (FIG. 4C) which turns on the transistor amplifier 70 in the audio control circuit 12 thereby energizing the relay 60 which connects the audio input 14 to the audio output 26 enabling the television receiver to produce sound. Secondly, the initial reset pulse sets a power control flip-flop 72 in the power control circuit 22. This produces a positive voltage at the Q output (FIG. 4D) of the flip-flop 72 which turns on a transistor amplifier 74 energizing the relay 62 thereby enabling the television receiver by connecting the control device power input 24 to the power output 26. Finally, the reset pulse prepares the time-delay circuit 20 for measuring the aforementioned predetermined period of time by clearing a series of counters in 76 included therein.

In the case of this embodiment an exemplary photosensitive circuit is shown as part of the photo-responsive circuit 10. In order to actuate the control device a light beam is caused momentarily to illuminate the photocell 78 thereby reducing its impedence which produces a negatively going pulse at the input to the D.C. amplifier 80. It is recognized that any of a variety of photocell devices might be utilized to perform this function and that other D.C. amplifier circuits might also be used for amplifying the signal produced by the photocell. In this case a light sensitivity control 82 is provided by a variable resistor and a special automatic lens 84 is placed in front of the photocell 78. The sensitivity control 82 permits the viewer to adjust the television accessory to react to an appropriate amplitude of light in a specific average room illumination. The automatic lens includes a material which causes the lens to become darker in response to increased average illumination and lighter in response to decreased average illumination, like lenses frequently used in automatic sun glasses for example, which enables the control device to automatically adjust to average room illumination without having to readjust the sensitivity control.

The relatively slow pulse produced by the photocell 78 when illuminated by a pulse of light is amplified by the D.C. amplifier 80 and applied to a schmitt trigger 86 which produces a corresponding signal with relatively fast rise and fall times (FIG. 4E.). The output pulse of the schmitt trigger 86 is applied to the clock input of the audio control flip-flop 68 and causes the flip-flop 68 to change states. This produces a zero voltage level or 0 at its $\overline{Q}$ output (FIG. 4C) and a positive voltage level of 1 at its Q output (FIG. 4F). The 0 $\overline{Q}$ output of flip-flop 68 turns off the transistor driver 70 of the audio control circuit 12 which de-energizes the relay 60 causing a switch 86 operated thereby to disconnect the audio output 16 from he audio input 14 and connect the resistor 33 to the audio input 14, muting the sound of the television. Each time a new pulse of light illuminates the photo-cell 78 a pulse is generated by the schmitt trigger 86 which clocks the audio control flip-flop 68 causing it to change state; thus, the television audio output is alternately muted and enabled with each successive light pulse illuminating the control device (FIGS. 4E and 4C).

When the audio control flip-flop 68 is placed in a state whereby the television audio is muted, the time-delay circuit 20 begins to measure the predetermined time period after which it is assumed that the viewer has forgotten about the television. The 1 output of the flip-flop 68 is applied to a NAND gate 88. This permits a series of pulses generated by a clock 90 to pass to the series of counters 76 (FIG. 4G). In the present embodiment the clock is designed to produce one pulse per second. The clock pulses are applied to a first decade counter 92 which drives a second decade counter 94 which in turn drives a divide-by-six counter 96 resulting in the series of counters 76 which produces one output pulse for every 600 input pulses or ten minutes; however, it is recognized that various combinations of clock periods and counters might be used to achieve an appropriate predetermined time period.

The output of the series of counters 76 is applied to a one-shot multi-vibrator 98 which produces a single pulse suitable for clearing the power control flip-flop 72 of the power control circuit 22. Assuming that no intervening occurrence takes place to stop the time-delay circuit 20, the power control flip-flop 72 will be cleared after 10 minutes, de-energizing the relay 62, which opens a switch 63 operated thereby and disables the television by shutting off its power (FIGS. 4H and 4D). However, if prior to the end of the 10-minute time period the photocell 78 is again illuminated, changing the state of the audio control flip-flop 68 so as to produce a 0 Q output and a 1 $\overline{Q}$ output the NAND gate 88 will be closed, stopping the application of clock pulses to the series of counters 76, and a 1 input will be applied to an AND gate 100 in the time-delay circuit. The gate 100 will then permit pulses from the clock 90 to be applied to the clear inputs of the series of counters 76 (FIG. 4I), returning the counters to zero. The AND gate 100 permits the series of counters 76 to be cleared either by a reset pulse or a second actuating light pulse. The initial reset pulse clears the series of counters indirectly by clearing the flip-flop 68 which opens the gate 100 to permit clock pulses to pass to the counters; likewise, a change of state of the flip-flop 68 resulting from an audio-restoring light beam actuation will open the gate 100.

If the television control device is designed to be continuously on even when the television itself is shut off the reset circuit 28 should be provided with a manual reset switch 104 for triggering the one-shot multi-vibrator 66 to reset the control device and turn the television receiver on. For example, a spring-return switch 104 could be provided which ordinarily permits a capacitor 106 to charge up and discharges the capacitor to the input of an inverter 108 when actuated thereby producing a short pulse applied to the input of the one-shot multi-vibrator 66. Alternatively the control device could be designed to shut off along with the television receiver and a spring-return momentary-contact switch 110 could be placed in parallel with the switch 63 of the relay 62 for turning the entire system on long enough for the starting circuit 64 to initiate a reset pulse which would, in turn, maintain the television receiver and the control device in an on state. Similarly, if the control device is designed to turn off automatically along with the television receiver, a power switch 114 of the spring-loaded, normally closed type could be included for manually shutting off the television receiver. Thus it can be seen that the primarily electronic version and primarily electro-mechanical version are analagous, with the exception that the primarily electro-mechanical embodiment requires an override circuit 56 to permit the viewer to turn the television receiver back on soon after automatic shut-off, whereas no such circuit is required in the primarily electronic version because the timing mechanism of the time-delay circuit 20 is cleared simultaneously with the resetting of the control device.

Although exemplary circuits have been disclosed and discussed, it should be understood that these examples are not set forth as limitations on the scope of the invention, and other circuit configurations may not necessarily depart from the concepts of this invention. Furthermore, the terms and expressions which have been employed in the foregoing abstract and specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. In a television receiver having an electrical power input circuit and an audio output circuit, a control device comprising:
   a. photo-responsive circuit means for producing at least one control signal in response to the illumination of a portion thereof;
   b. audio control circuit means connected responsively to said photo-responsive circuit means and to the audio output circuit of the television receiver for varying the audio output amplitude of the receiver in response to said control signal;
   c. time delay circuit means connected responsively to said photo-responsive circuit means for automatically producing a disabling signal a predetermined time period following the production of said control signal;
   d. power control circuit means connected responsively to said time-delay circuit means and to the electrical power-input circuit of the television receiver for disabling the receiver in response to said disabling signal; and
   e. reset circuit means connected to said power control circuit means for enabling the television receiver.

2. The control device of claim 1 wherein said audio control circuit means includes means for alternately muting the audio output of the television receiver and restoring its amplitude to the original level in response to each successive control signal produced.

3. The control device of claim 2 wherein said time-delay circuit means produces said disabling signal only when the audio output of the television receiver is muted.

4. The control device of claim 2 wherein said audio output circuit of the television receiver includes an electrical audio output signal source and a sound producing means connected responsively thereto, said audio control circuit means of the control device being interposed electrically between the signal source and the sound producing means of the receiver, and wherein said audio control circuit means includes means for disconnecting the sound producing means for the signal source in order to mute the television receiver.

5. The control device of claim 4 wherein said audio control circuit means of the control device includes means for a substitute impedence to the signal source simlultaneously with disconnection of the sound producing means.

6. The control device of claim 1 wherein said time-delay circuit means includes means for prohibiting said time-delay circuit means for producing a disabling signal within said predetermined time period following the production of said control signal if, prior to the end of said predetermined time period, a second control signal is produced by said photo-responsive circuit means.

7. The control device of claim 6 wherein said audio control circuit means of said control device includes means for alternately muting the audio output of the television receiver and restoring its amplitude to the original level in response to each successive control signal produced by said photo-responsive circuit means, and wherein said time-delay circuit means produces said disabling signal only following a reduction in the amplitude of the audio output.

8. The control device of claim 1 further comprising an override circuit means connected to said time-delay circuit means for inhibiting the effect of said time-delay circuit means so as to thereby enable the television receiver.

9. The control device of claim 8 wherein said time-delay circuit means includes a thermal time-delay relay for measuring said predetermined time period and said override circuit means comprises a switch for bypassing said thermal relay.

10. The control device of claim 1 wherein said control device comprises an accessory having said photo-responsive circuit means, audio control circuit means, time-delay circuit means, power-control circuit means and reset circuit means interconnected as an integral unit, said control device including terminal means detachably connecting said control device to said audio output circuit and electrical power input circuit respectively of said television receiver for permitting the detachment of said control device from said receiver without disrupting said interconnections of said integral unit.

11. A method for controlling a television receiver which produces an audio output, said method comprising:
   a. muting the audio output automatically in response to the receipt of a first light signal;
   b. measuring the time following the receipt of the first light signal; and
   c. entirely disabling the television receiver automatically if a predetermined period of time is measured before a second light signal is received.

12. The method of claim 11 further comprising the steps of preventing said disabling step (c) automatically in response to the second light signal, and simultaneously restoring the audio output to its original level automatically in response to the second light signal if the second light signal occurs before the end of said predetermined period of time.

* * * * *

UNITED STATES PATENT AND TRADEMARK OFFICE
CERTIFICATE OF CORRECTION

PATENT NO. : 3,940,701
DATED : February 24, 1976
INVENTOR(S) : Edward Novitski

It is certified that error appears in the above-identified patent and that said Letters Patent are hereby corrected as shown below:

| | | |
|---|---|---|
| Col. 2, | Line 44 | Change "electromechanical" to --electro-mechanical--. |
| Col. 3, | Line 9 | Change "predetemined" to --predetermined--. |
| Col. 4, | Lines 52 and 53 | Change "electrome-chanical" to --electro-mechanical--; |
| | Line 59 | After "30 is" delete the word --a--. |
| Col. 6, | Line 64 | Change "26" to --16--. |
| Col. 7, | Line 41 | Change "of 1" to --or 1--; |
| | Line 45 | Change "he" to --the--. |
| Col. 8, | Line 50 | Change "normally closed" to --normally-closed--; |
| Col. 9, | Line 19 | Change "time delay" to --time-delay--; |
| | Line 51 | Change "for" to --from--; |
| | Line 54 | After "means for" add the word --connecting--. |
| | Line 55 | Change "simlultaneously" to --simultaneously--. |
| Col. 10 | Line 3 | Change "for" to --from--. |

Signed and Sealed this

Twenty-fourth Day of August 1976

[SEAL]

Attest:

RUTH C. MASON
Attesting Officer

C. MARSHALL DANN
Commissioner of Patents and Trademarks